US007692377B2

(12) United States Patent
Nakamura et al.

(10) Patent No.: US 7,692,377 B2
(45) Date of Patent: Apr. 6, 2010

(54) LIGHT EMITTING DISPLAY DEVICE PROVIDED WITH EXTERNAL CONNECTION TERMINAL LOCATED AT PERIPHERAL PORTIONS OF A DISPLAY AREA

(75) Inventors: Kohichi Nakamura, Kawasaki (JP); Somei Kawasaki, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 719 days.

(21) Appl. No.: 11/559,609

(22) Filed: Nov. 14, 2006

(65) Prior Publication Data
US 2007/0146246 A1    Jun. 28, 2007

(30) Foreign Application Priority Data
Nov. 16, 2005   (JP)   .............................. 2005-331600

(51) Int. Cl.
*H01L 51/50*   (2006.01)
*H01L 51/52*   (2006.01)
*H05B 33/02*   (2006.01)
*H05B 33/08*   (2006.01)

(52) U.S. Cl. ...................... 313/505; 313/500; 313/503; 345/44; 345/45; 345/76; 315/169.3

(58) Field of Classification Search ......... 313/500–512; 315/169.3; 345/44–46, 76–81
See application file for complete search history.

(56) References Cited
U.S. PATENT DOCUMENTS
7,019,458 B2    3/2006  Yoneda

2005/0189857 A1*  9/2005  Kobori ........................ 313/504
2005/0200270 A1*  9/2005  Kwak et al. .................. 313/502
2007/0120473 A1   5/2007  Nakamura et al.
2007/0120779 A1   5/2007  Nakamura et al.
2007/0146245 A1   6/2007  Goden et al.

FOREIGN PATENT DOCUMENTS
JP    2004-047458    2/2004
JP    2005-158292    6/2005

* cited by examiner

*Primary Examiner*—Mariceli Santiago
(74) *Attorney, Agent, or Firm*—Fitzpatrick, Cella, Harper & Scinto

(57) ABSTRACT

A display apparatus capable of preventing thermal deterioration of an organic EL layer to improve a reliability without increasing a frame area thereof includes a display area, a circuit and wiring area, a pixel circuit common supply line, a contact hole, an external connection terminal, and an adhesion area. In the display area, EL devices and pixel circuits are arranged in a matrix. In the contact hole, a common voltage line and a transparent electrode electrically connected to an output of the EL device are electrically connected to each other. To the external connection terminal, an image signal, a control signal, and electric power are externally supplied. The contact hole and the common voltage line are disposed to surround a peripheral of the display area. To the pixel circuit common supply line, the electric power is supplied from the external connection terminal. In a peripheral portion of the display area where the external connection terminal is disposed, the pixel circuit common supply line is disposed outside the contact hole and the common voltage line with respect to the display area.

4 Claims, 6 Drawing Sheets

LIGHT EMITTING DISPLAY DEVICE PROVIDED WITH EXTERNAL CONNECTION TERMINAL LOCATED AT PERIPHERAL PORTIONS OF A DISPLAY AREA

FIELD OF THE INVENTION AND RELATED ART

The present invention relates to a current drive-type display apparatus and cameras which have an area in which a plurality of constituents each including a current drive-type device and a device control circuit for controlling current passing through the current drive-type device is disposed. The present invention is suitably used in a display apparatus using electroluminescence (EL) devices which produce luminescence by passing current through the devices and are arranged in a matrix.

In recent years, display apparatuses using EL devices have attracted attention as a display apparatus in place of cathode ray tube (CRT) or liquid crystal device (LCD).

In an organic EL panel, when moisture permeates an EL device, an associated pixel results in a defective dot. In addition, adjacent pixels of the moisture-permeated pixel are successively adversely affected by the moisture-permeated pixel to increase a dark spot as a non-luminous area. Finally, the entire display panel cannot effect display. For this reason, it is essential to block external (ambient) air and moisture from entering the EL device. For example, Japanese Laid-Open Patent Application (JP-A) 2005-158292 has disclosed a moisture-blocking technology by surrounding a pixel area two-dimensionally with a moisture-blocking structure formed of an inorganic material.

Further, organic solids such as a luminescent material, a hole injection material, and an electron injection material which constitute an organic EL device are thermally decomposed or crystallized to invite a deterioration in performance of the organic EL device. Accordingly, in order to provide a high-reliability organic EL device, it is necessary to prevent the organic solids from being thermally deteriorated in performance. JP-A 2004-047458 has disclosed a constitution in which a heat conductive spacer is disposed between a cathode layer and drying agent of the organic EL device in order to not only prevent damage of the organic EL device but also prevent deterioration in device characteristic due to temperature increase by improving a heat dissipation characteristic.

On a side (edge) of the display apparatus where an external (connection) terminal is disposed, current is concentrated, so that Joule heat is problematic. The Joule heat is generated due to a wiring resistance or a contact resistance in the case of providing a contact hole. When the contact hole or an interconnecting line through which large current passes is located in the neighborhood of a display area, a periphery of the contact hole or the interconnecting line is locally heated to result in early deterioration of the organic EL device. When a part of the display apparatus is early deteriorated compared with another part of the display apparatus, the part of the display apparatus is noticeably visible as irregularities in luminance and color.

SUMMARY OF THE INVENTION

An object of the present invention is to prevent a thermal deterioration of an organic EL device to improve a reliability of a display apparatus without increasing a frame area of the display apparatus.

A specific object of the present invention is to provide the display apparatus.

According to an aspect of the present invention, there is provided a display apparatus comprising:

a plurality of light-emitting devices and a plurality of device control circuits for controlling current passing through the light-emitting devices, the light-emitting devices and the device control circuits being arranged on a substrate in a row direction and column direction to form a display area, wherein each of the light-emitting devices is disposed between a lower first electrode and an upper second electrode on the substrate, the first electrode being provided for each light-emitting device and electrically connected to an associated device control circuit for the light-emitting device, and the second electrode being an electrode common to all the light-emitting devices and extended to a periphery of the display area;

a first interconnecting line, disposed along a side of the display area, for supplying electric power to the device control circuits through power lines disposed in the display area;

a second interconnecting line disposed along a side of the display area to have an overlapping area overlapping with the extended second electrode through an insulating layer disposed therebetween, the second interconnecting line being electrically connected to the extended second electrode in a contact hole provided in the insulating layer in the overlapping area; and an external connection terminal disposed at a peripheral portion along any one of sides of the display area and electrically connected to the first interconnecting line and the second interconnecting line, wherein at the peripheral portion of the side of the display area at which the external terminal is disposed, the first interconnecting line is disposed outside the second interconnecting line with respect to the display area.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Figure 1:
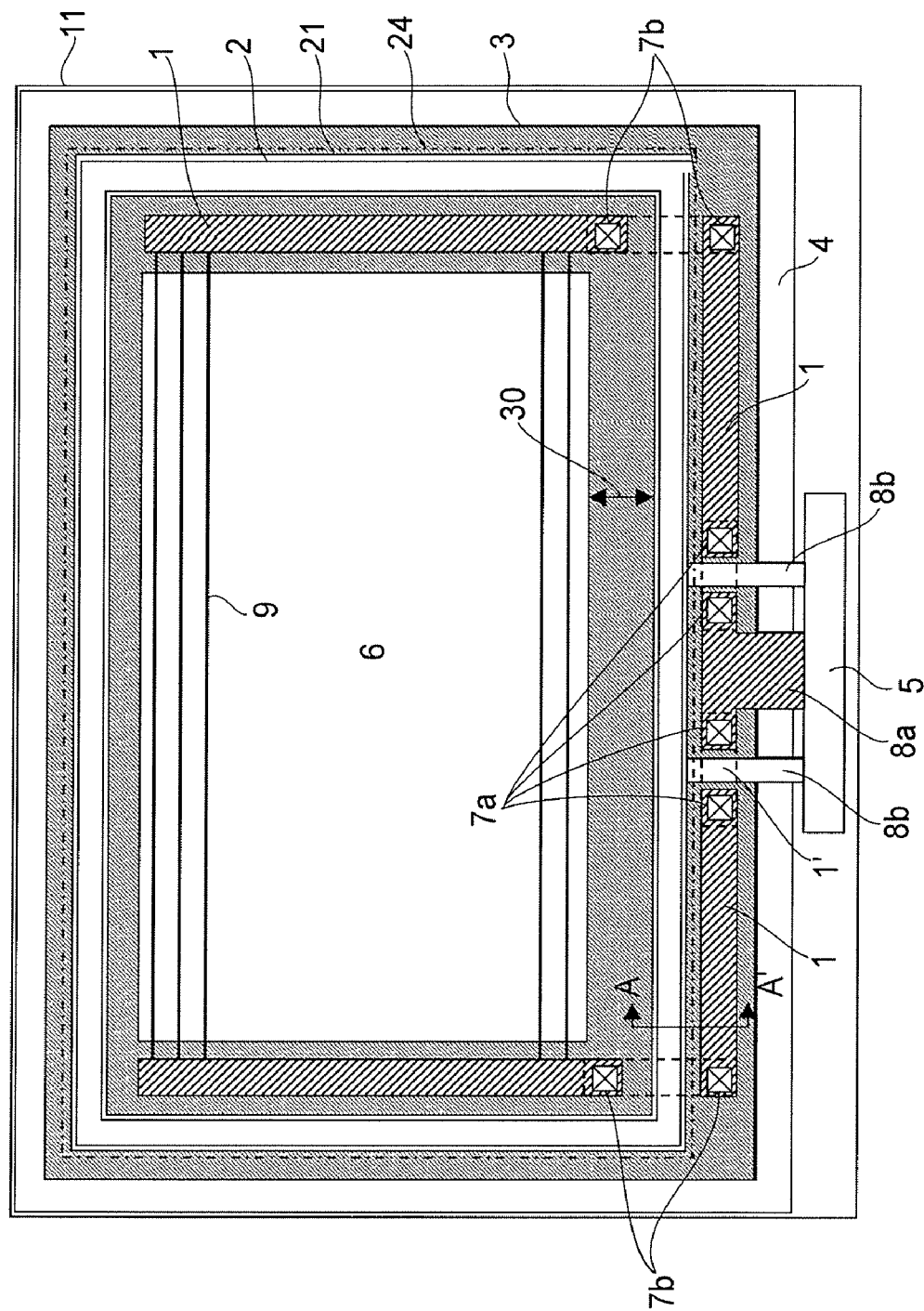
FIG. 1 is a schematic plan view for illustrating a display apparatus according to Embodiment 1 of the present invention.

Hereinbelow, embodiments of a current drive-type display apparatus according to the present invention will be described more specifically with reference to the drawings.

In the display apparatus of the present invention, a light-emitting (luminescence) device may be a functional device disposed between a lower first electrode and an upper second electrode. Examples thereof may include an organic EL device, an inorganic EL device, a heat generation device (resistance device). Particularly, as a current drive-type device, an EL device (current drive-type light-emitting device) represented by the organic EL device may suitably be used.

It is possible to constitute a display apparatus by one-dimensionally or two-dimensionally arrange constituents including the current drive-type light-emitting device and a switching element in combination.

The display apparatus may be a linear display apparatus for displaying image information, an active matrix-type display apparatus, etc. The linear display apparatus can be used as a scanner and can constitute an image recording apparatus, such as an optical printer or a copying machine, by being used in combination with a photosensitive member. The active matrix-type display apparatus can be used as a viewer for use in a flat panel television, digital camera, digital video camera, etc., or a display portion of a mobile phone, etc.

A device control circuit is a circuit for controlling current passed through the above described current drive-type light-emitting device and a simplest constitution thereof is a transistor. In embodiments described later, the device control circuit has such a circuit constitution that a value of current to be supplied to a control electrode (gate etc.) for a transistor for supplying current to the light-emitting device is programmed in advance. The device control circuit includes the transistor for supplying current to the light-emitting device and a transistor for writing the current value in the control electrode (gate etc.) for the former transistor.

In a preferred embodiment, the present invention is applied to an active matrix-type display apparatus using an EL device constituting a current drive-type light-emitting device for controlling a luminance (brightness) depending on inputted current. More specifically, this display apparatus has a display area in which pixels (cells) each including the EL device and a pixel circuit (as the device control circuit) constituted by a TFT element for controlling current to be inputted into the EL device are arranged in a matrix. Further, as peripheral circuits disposed outside the display area, the display apparatus includes a column control circuit, disposed every column pixel, for outputting a data signal for outputting current to be inputted into the pixel circuit to a data line and a scanning line drive circuit (a column shift register and a row shift register) for outputting a scanning signal to be inputted into the pixel circuit to a scanning line.

Further, the display apparatus includes an external (connection) terminal for supplying an image signal, a control signal, power and the like to the display area and the peripheral circuits and a transparent electrode (second electrode) formed of a transparent material connected to the EL device of each pixel. The display apparatus further includes a common supply line (first interconnecting line), for pixel circuit, for supplying power to the pixel circuit, a common voltage (potential) line (second interconnecting line) of the pixel circuits, and a common supply line, for digital circuit, for supplying power to digital circuit in the peripheral circuits. The EL device is disposed between a pixel electrode as the lower first electrode and the transparent electrode as the upper second electrode on a substrate.

Of the above described lines, the common supply line for pixel circuit, the common voltage line, and the common supply line for digital circuit are connected to the external terminal. The common voltage line is connected to the transparent electrode through a contact hole. The contact hole and the common voltage line are disposed to surround the display area. The transparent electrode is formed to cover the display area and the contact hole.

Embodiment 1

A display apparatus according to this embodiment will be described with reference to FIGS. 1-3.

FIG. 1 shows a schematic plan view of the display apparatus of this embodiment.

On a substrate 11, a plurality of (unit) pixels each including an EL device and a pixel circuit (FIG. 2) is arranged in a matrix in row and column directions to form a display area 6 having a rectangular shape.

Outside the display area 6, a peripheral area (circuit and wiring area) 3 in which the peripheral circuits such as the column control circuit for controlling current to be inputted into the pixel circuit for each column pixel, the column shift register, and the row shift register, and interconnecting lines (wiring) specifically described later are formed.

In the peripheral area 2, a pixel circuit common supply line 1, connected to an external constant voltage source (not shown), for supplying current to the display area 6 and a common voltage line 21 for recovering the current are also disposed. These interconnecting lines for power supply are formed in a wide pattern since all the currents flowing in the EL device are concentrated at the interconnecting lines. Further, the interconnecting lines require a low sheet resistance, so that the interconnecting lines are formed in a film and patterned with the same material as that of a source electrode, a drain electrode, or a gate electrode of TFTs for the pixel circuit and the peripheral circuit, simultaneously with these electrodes.

The EL device is formed on the pixel circuit while being electrically isolated from the pixel circuit. For this reason, the upper and lower (two) electrodes of the EL device are formed on an insulating film (flattening film 28 described later and not shown in FIG. 1) for covering the pixel circuit and the peripheral circuits and are electrically isolated from these circuits.

From the pixel circuit common supply line 1, a plurality of power lines 9 is extended in the display area 6 so as to supply current to each pixel circuit. The current passing through the EL device via the pixel circuit flows into a cathode of the EL device. The cathode is formed with a continuous electroconductive film 24, as indicated by alternate long and short dashed lines in FIG. 1, for covering the entire display area so as to keep a reference potential common to all the pixels. The cathode is formed with a transparent electroconductive film 24 in the case of a top emission-type EL apparatus from which light is emitted upwardly with respect to the substrate.

The cathode electroconductive film 24 is also extended into the peripheral area 3 outside the display area 6 and overlaps with the common voltage line 21 in the peripheral area 3. In the area in which the cathode and the common voltage line 21 overlap with each other, the insulating film, i.e., the flattening film 28 is provided with the contact hole 2 through which the cathode and the common voltage line 21 are connected to each other in a contact manner. The contact hole 2 is disposed together with the common voltage line 21 along an outer periphery of the rectangular display area 6, with a width somewhat smaller than the common voltage line 21, so as to surround the entire periphery of the display area 6.

Outside the peripheral area 3, an external terminal 5, through which electric power is externally supplied, and an adhesion area 4 for effecting adhesion of a sealing substrate and disposed.

The external terminal 5 is, in the embodiment of FIG. 1, disposed at a central portion of a lower outer side of the display area 6. The pixel circuit common supply line 1 is connected to the external terminal 5 through a lead-out line 8a. The common voltage line 21 is connected to the external terminal 5 through two lead-out lines 8b. To each of the pixel circuit common supply line 1 and the common voltage line 21, a constant voltage is supplied from the external terminal 5.

The pixel circuit common supply line 1 is continuously extended to the external terminal 5 through the lead-out line 8a at the lower side of the display area 6. The pixel circuit common supply line 1 is extended from contacts with the lead-out line 8a in right and left direction so that a right-hand common supply line portion and a left-hand common supply line portion are extended, outside the common voltage line 21 when viewed from the display area 6 side, in directions opposite to each other with respect to the lead-out line 8a. After these common supply line portions reach right and left ends, they enter the inside of the common voltage line 21 to extend upwardly in parallel to right and left sides of the display area. The thus extended right-hand common supply line portion and left-hand common supply line portion of the pixel circuit common supply line 1 are disposed to have line symmetry.

The plurality of power lines 9 provided every row of the display area 6 is connected together to the pixel circuit common supply line 1 at the right and left sides of the display area 6. In this embodiment, the power lines 9 and the pixel circuit common supply line 1 are connected with each other in a ladder-like shape, and the pixel circuit common supply line 1 has a U-character shape.

As described above, the pixel circuit common supply line 1 is arranged outside the contact hole 2 and the common voltage line 21 with respect to the display area 6 at the lower side portion where the external terminal 5 is disposed.

In this arrangement, the pixel circuit common supply line 1 at the lower side portion and the lead-out lines 8b intersect with each other. At each of the intersections, a lower interconnecting line 1' (enclosed by a broken line) and contact holes 7a are provided so as to form a crossing with an overpass and underpass. The contact hole 7a is provided by penetrating a gate insulating film and interlayer insulating film of TFT, and the lower interconnecting line 1' is formed of metal identical to that of the gate electrode.

Different from the contact hole 2, the contact hole 7a has a small area, so that heat generation is locally caused to occur when the contact hole 7a has a contact resistance. This results in an abnormal display characteristic when the display area is adversely affected by a local temperature increase caused in the peripheral area.

However, in this embodiment shown in FIG. 1, the contact holes 7a are separated from the display area 6 by the common voltage line 21, so that it is possible to prevent a change in luminescent characteristic of the EL device due to the influence, of local heat generation caused by the contact resistance of the contact holes 7, on the display area 6.

The pixel circuit common supply line 1 is disposed inside the contact hole 2 and the common voltage line 21 at the right and left sides of the display area where the external terminal 5 is not disposed. This is because the power lines in the display area 6 are directly connected to the pixel circuit common supply line 1. For this purpose, contact holes 7b are required to be disposed at intersections between the pixel circuit common supply line 1 and the common voltage line 21 at lower-right and lower-left corners. However, these contact hole 7b are separately disposed at right and left (two) positions, so that the influence on the display area 6 can be reduced as small as possible.

In FIG. 1, the lead-out line 8a for the common supply line 1 is a single line and on both sides thereof, the two lead-out lines 8b for the common voltage line 21 are disposed. However, it is also possible to dispose a single lead-out line 8b on either one side of the lead-out line 8a for the common supply line 1. In this case, only two contact holes 7a are required, thus alleviating heat generation by that much.

Incidentally, between the display area 6 and the common voltage line 21, digital circuit common supply lines for supplying electric power to digital circuits such as a column shift register and a row shift register in the peripheral area 3 are disposed. These interconnecting lines such as the digital circuit common supply lines are connected to the external terminal 5.

In addition, other circuits and interconnecting lines including an image signal interconnecting line for transmitting an image signal externally inputted to the column control circuit through the external terminal 5, a control signal interconnecting line for transmitting various control signals externally inputted to the peripheral circuits through the external terminal 5, and an input circuit for outputting externally inputted signal after converting a level thereof into a different level, are disposed.

The input circuit also include a circuit for converting a level of a control signal inputted from the external terminal 5 into a level of operation voltage for the display apparatus. For example, such a circuit may be an input circuit for externally inputting a horizontal scanning control signal, an input circuit for externally inputting a vertical scanning control signal, etc. Incidentally, from FIG. 1, all the interconnecting lines other than those connected to the pixel circuit common supply line 1 are omitted.

Figure 2:
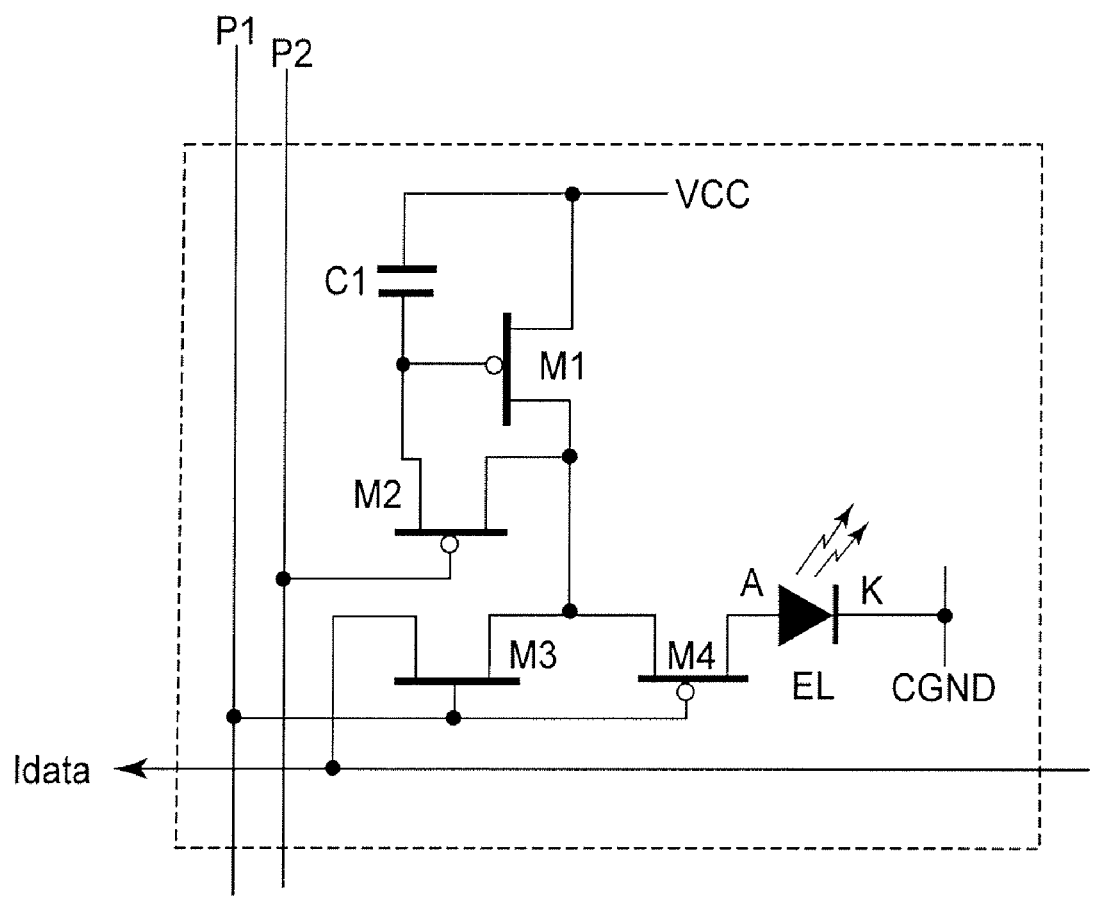
FIG. 2 is a circuit diagram showing an embodiment of a pixel circuit of a current setting-type including an EL device.

FIG. 2 shows a pixel circuit of current setting-type including the EL device.

Referring to FIG. 2, P1 and P2 are scanning signal lines for supplying scanning signals from the row shift register, and a current data (Idata) as a data signal converted into a current value depending on a voltage value of the image signal by the column control circuit is inputted. An anode of the EL device is connected to a drain terminal of a TFT (M4) and a cathode is connected to a grounding potential line CGND. Further, TFTs (M1, M2 and M4) are P-type TFT and a TFT (M3) is N-type TFT. A source terminal of the TFT (M1) is connected to a (power) source potential line VCC. In FIG. 2, an interconnecting line for the grounding potential line CGND is connected to the common voltage line, and an interconnecting line for the source potential line VCC is connected to the pixel circuit common supply line.

Hereinbelow, a principal circuit operation will be described.

First, when Idata is inputted, a high-level signal is inputted into the scanning signal line P1 and a low-level signal is inputted into the scanning signal line P2, so that the TFTs (M2 and M3) are turned no and the TFT (M4) is turned off. In this state, the TFT (M4) is not placed in a conduction state, so that current cannot pass through the EL device. Therefore, the EL device does not emit light. In this state, by the current data (Idata), a voltage depending on a current drive ability of the TFT (M1) is generated in a capacitor C1 disposed between a gate terminal of the TFT (M1) and the source potential line VCC.

Next, when current is supplied to the EL device, a low-level signal is inputted into the scanning signal line P1 and a high-level signal is inputted into the scanning signal line P2, so that the TFT (M4) is turned on and the TFTs (M2 and M3) are turned off. In this state, the TFT (M4) is placed in the conduction state, so that based on a voltage caused in the capacitor C1, current depending on the current drive ability of the TFT (M1) is supplied to the EL device. As a result, the EL device emits light at a luminance corresponding to the supplied current.

Incidentally, in this embodiment, the pixel circuit shown in FIG. 2 is used as an example. However, the pixel circuit usable in the present invention is not limited thereto but may also be applicable to other pixel circuits of the current setting type or of a voltage setting-type.

Figure 3:
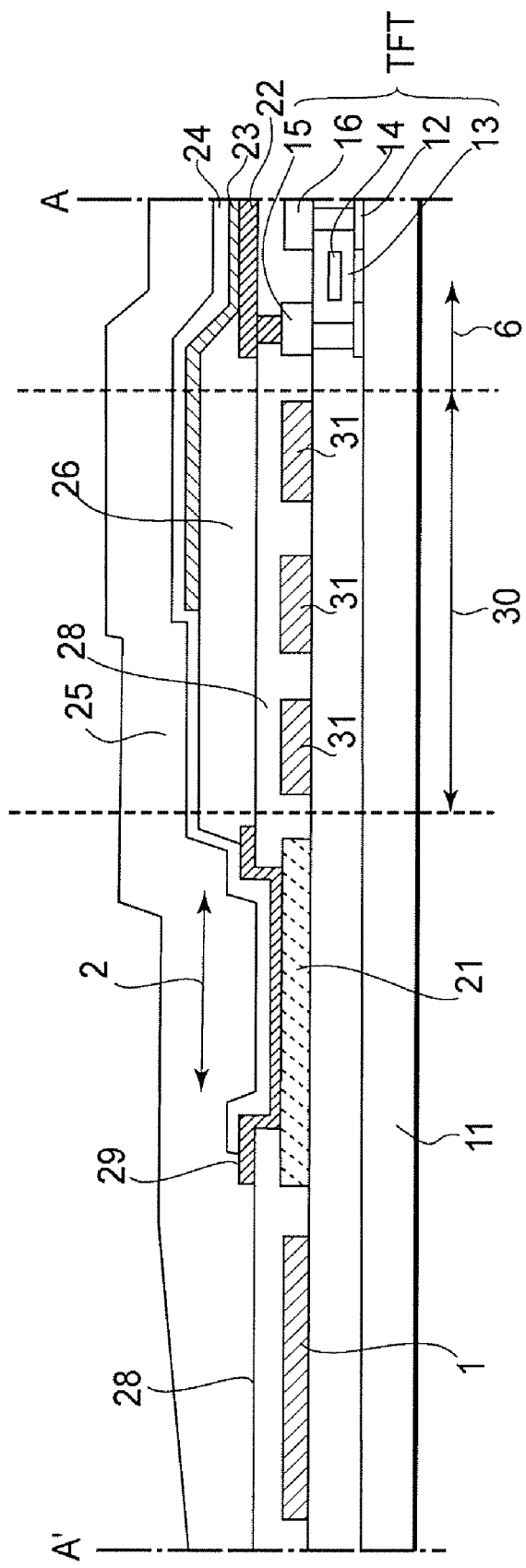
FIG. 3 is a schematic sectional view taken along A-A' line shown in FIG. 1.

FIG. 3 is a schematic sectional view taken along A-A' line shown in FIG. 1.

Referring to FIG. 3, on the substrate 11, a semiconductor film 12 of polysilicon or the like constituting an active layer (channel layer) of the TFT is formed. On the semiconductor layer 12, an interlayer insulating film 13 for forming a gate insulating film of the TFT, a gate electrode 14, a drain electrode 15, and a source electrode 16 are formed. Thus, the TFT for the pixel circuit is formed on the substrate 11. In FIG. 3, one of the TFTs constituting the EL device is shown.

In this embodiment, a top emission-type organic EL display apparatus in which light is emitted from the top surface opposite from the substrate 11 on which the TFT for the pixel circuit is disposed, is used as an example.

More specifically, to an output of the drive TFT for the pixel circuit, a pixel electrode (first electrode) 22 which is one of electrodes for sandwiching the electrode device and also functions as a light reflection layer is connected. On the pixel electrode 22, an organic layer 23 constituting the EL device and an electroconductive film (transparent electrode) 24 which is the other electrode (second electrode) for sandwiching the EL device and formed of a transparent conductive material such as indium tin oxide (ITO), are successively formed.

On the transparent electrode (electroconductive film) 24, a protection film (passivation film) 25 for protecting the EL device is disposed. The transparent electrode 24 is connected to the common voltage line 21 through a metal layer 29 formed of the same material as that of the pixel electrode 22 in an area in which the contact hole 2 is provided. Further, the peripheral area 3 is divided into two areas by the contact hole 2. In one divided area corresponding to an area between the display area 6 and the common voltage line 21, the peripheral circuits to be disposed therein, interconnecting lines 31, an insulating film 28 for flattening the surface of the pixel electrode 22, and a device isolation film 26 are formed.

In the organic EL display apparatus, the EL device is susceptible to moisture, so that a deterioration of the EL device is caused by moisture permeation. For this reason, it is necessary to protect the EL device from external moisture permeation. Accordingly, the protection film 25 covers the entire display area 6. By forming the protection film 25 in a predetermined thickness, it is possible to block the moisture permeation into the display area 6 in a vertical direction in FIG. 3.

Next, means for protecting the EL device from the moisture permeation in a horizontal direction in FIG. 3 will be described.

As shown in FIG. 3, the common voltage line 21 and the transparent electrode 24 are connected in the contact hole 2 through the metal layer 29 formed of the same material as that of the pixel electrode 22. As described above with reference to FIG. 1, by surrounding the periphery of the display area 6 with the contact hole 2, the flattening insulating film 28 is divided into two portions by the contact hole 2 and the metal layer 29. As a result, the moisture is blocked from entering the inside of the common voltage line 21 through the flattening insulating film 28 in the horizontal direction. In this manner, it is possible to block the moisture permeation into the display area 6.

Further, as described above, in order to completely block the external (ambient) moisture, it is necessary to form the protection film 25 in the predetermined thickness in the contact hole 2. The protection film 25 has a small thickness at an end portion and is gradually thicken from the end portion due to its film formation process. For this reason, in order to ensure the predetermined thickness of the protection film 25 in the area surrounded by the contact hole 2 and on the contact hole 2, a predetermined spacing is required outside the contact hole 2 with respect to the display area 6. In the predetermined spacing in which the protection film 25 has a smaller thickness, the pixel circuit common supply line 1 is disposed.

When the organic layer 23 is formed, it is necessary to ensure a margin area 30 between the display area 6 and the contact hole 2. This margin area 30 is an area to be ensured in view of a forming process of the organic layer 23. In order not to increase a frame size of the display apparatus, a width of the margin area 30 is required to be fixed to a minimum of process rule. In the margin area 30, the above described peripheral circuits and the interconnecting lines 31 are disposed.

By employing the above described constitutions, this embodiment can achieve the following effects.

First, on the lower side portion where the external terminal 5 is disposed, the pixel circuit common supply line 1 is disposed outside the common voltage line 21 with respect to the display area 6, so that a distance between the display area 6 and the contact holes 7a for the pixel circuit common supply line 1 as a source of heat generation is increased in this embodiment. Therefore, heat generated by the contact holes 7a is less conducted to the organic EL device, so that it is possible to alleviate a performance deterioration of the organic EL device to improve a reliability of the display apparatus.

Further, into the pixel circuit common supply line 1 located at the lower side portion where the external terminal 5 is disposed, current necessary for the pixel circuits located right and left sides of the display area 6 flows concentratedly, so that heat is generated due to wiring resistance. A degree of this heat generation is larger than that of heat generation of the common voltage line 21 which generates heat to be dissipated into the entire cathode. BY disposing the common voltage line 21 close to the display area 6 and disposing the pixel circuit common supply line 1 outside the common voltage line 21 with respect to the display area 6, it is possible to reduce the influence of heat generation on the EL device in the display area 6.

In the display apparatus of this embodiment, the margin area 30 is disposed between the lower side of the display area 6 and the common voltage line 21 by disposing the pixel circuit common supply line 1 outside the common voltage line 21 with respect to the display area 6 at the lower side portion where the electrode 5 is disposed. In this margin area 30, as described above, it is possible to dispose the interconnecting lines 31 of low power consumption including the common supply line for digital circuit, the image signal interconnecting line, the control signal interconnecting line, etc., and the input circuit.

Further, at the lower side portion, the pixel circuit common supply line 1 is disposed in the area in which the above described protection (passivation) film 25 has a smaller thickness. However, this area is an originally necessary area, so that the area does not constitute a factor of an increase in frame area (size) of the display apparatus.

Further, in this embodiment, as shown in FIG. 1, the pixel circuit common supply line 1 is disposed inside the common voltage line 21 on the right and left sides of the display area 6 but may also be disposed outside the common voltage line 21. In this case, the contact holes 7b disposed at lower right and left corners can be omitted. However, at branching points between the pixel circuit common supply line 1 and the power lines 9, a contact hole is required to be provided every branching point. This arrangement is realized by forming the common supply line 1 with the same metal interconnecting line as that of source/drain electrodes, so that it is suitable for a constitution in which the power lines 9 are formed with the gate electrode. In that case, it is originally necessary to provide the contact hole for each branching point, so that the contact hole is disposed outside the common voltage line. As a result, the influence of heat generation on the display area 6 can be alleviated.

Further, the crossing with an overpass or underpass of the pixel circuit common supply line 1 and the common voltage line 21 may be established through a lower interconnecting line located below these interconnecting lines or an upper interconnecting line above these interconnecting lines. When the pixel circuit common supply line 1 and the common voltage line 21 are formed of the same material as that of the source/drain electrodes, the crossing can be established via a lower gate wiring layer. Alternatively, it is also possible to use an upper metal layer for forming the anode of EL device as a crossing interconnecting line.

In this embodiment, such a structure that the pixel circuit common supply line 1 is disposed to establish line symmetry with respect to the branching portion is described as an example. However, the present invention is not limited thereto. For example, the pixel circuit common supply line 1 may also be disposed at an end portion of the external terminal 5.

Embodiment 2

Next, Embodiment 2 will be described with reference to FIG. 4 which is a schematic plan view of a display apparatus of this embodiment.

Figure 4:
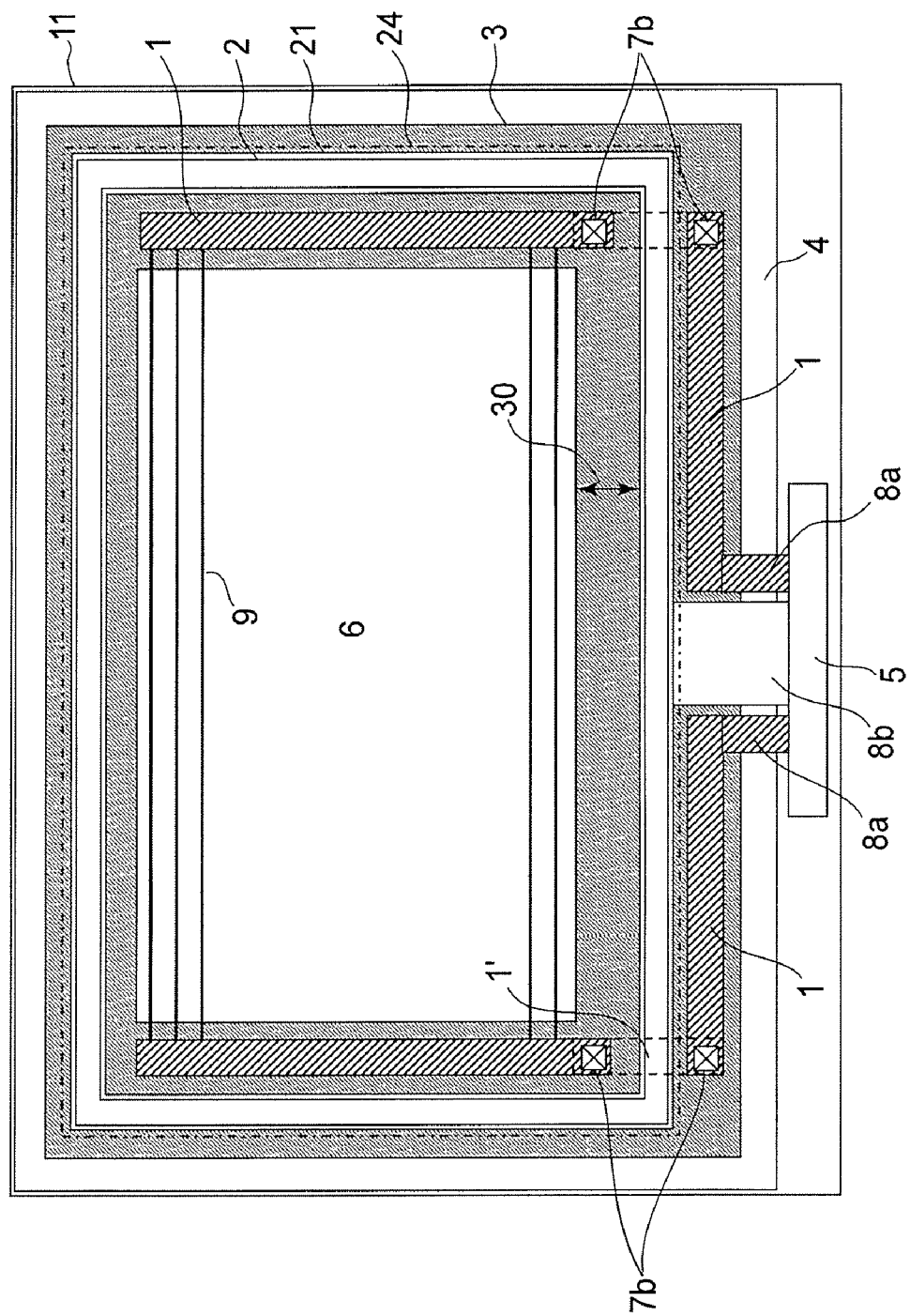
FIG. 4 is a schematic plan view for illustrating a display apparatus according to Embodiment 2 of the present invention.

Referring to FIG. 4, in the display apparatus, a lead-out portion 8b extended to the common voltage line 21 is connected to a central portion of the external terminal 5, and lead-out portions 8a are connected to the external terminal 5 at both sides of the lead-out portion 8b.

The pixel circuit common supply line 1 disposed on the right and left sides of the display area 6 supplies electric power to the pixel circuit through the power lines 9 in the display area 6. In FIG. 4, two (right and left) portions of the pixel circuit common supply line 1 independently supply electric power but may also be connected with each other by providing a lower interconnecting line below the lead-out portion 8b of the common voltage line 2 to establish the crossing wiring structure in the same manner as in the case of the contact hole 7a described with reference to FIG. 1. In this case, the contact hole 7a is provided but the position of the contact hole 7a is outside the common voltage line 21, so that the influence of heat generation can be alleviated similarly as in Embodiment 1.

Other constitutions of this embodiment are similar to those described with reference to FIGS. 1 to 3.

Also in the display apparatus of this embodiment, similarly as in Embodiment 1, the influence of heat generated by contact holes 7b and the common supply line themselves on the display area is alleviated, so that a deterioration of the organic EL device by heat can be prevented.

In this embodiment, the margin area 30 is formed between the display area 6 and the common voltage line 21 at the lower side portion of the display area, similarly as in Embodiment 1.

Comparative Embodiment

Figure 5:
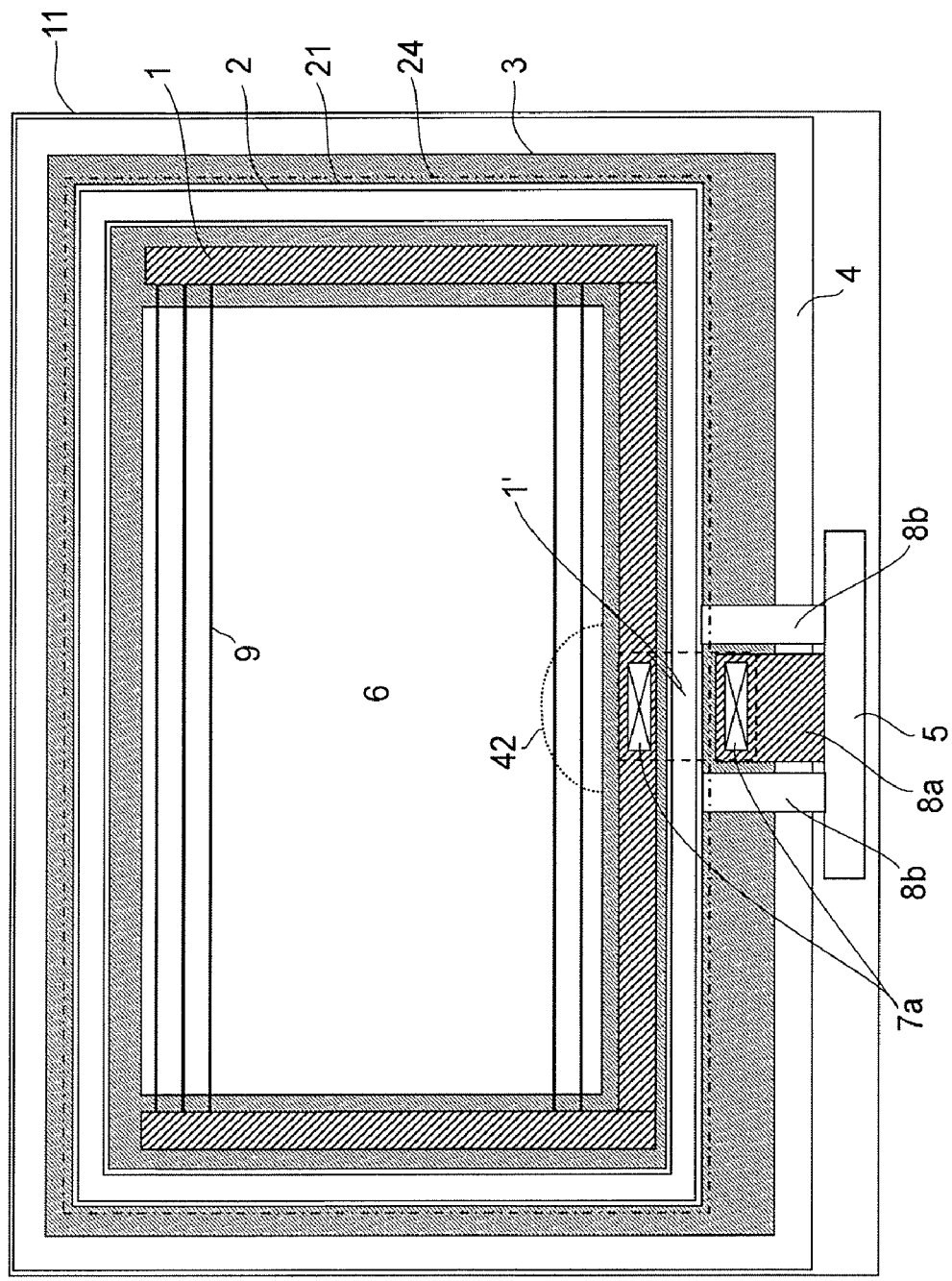
FIG. 5 is a schematic plan view for illustrating a display apparatus according to Comparative Embodiment in the present invention.

FIG. 5 is a schematic plan view of a comparative display apparatus of this comparative embodiment.

Different from Embodiments 1 and 2, in a display apparatus shown in FIG. 5 of this comparative embodiment, the pixel circuit common supply line 1 is disposed closer to the display area 6 than the common voltage line 21 at the lower side portion of the display area 6. Other constitutions of this comparative embodiment are identical to those in Embodiment 1 and FIG. 1.

Referring to FIG. 5, at the lower side portion of the display area 6 where the external terminal 5 is disposed, the pixel circuit common supply line 1 is connected to the external terminal 5 through two contact holes 7a and a lower interconnecting line 1'. In this case, one of the contact hole 7a is provided in the pixel circuit common supply line 1, so that heat generated by contact resistance is conducted to the display area 6 to heat a part (area) 42 of the display area 6. As a result, a temperature of the area 42 is increased to change an EL display characteristic.

A deterioration of the organic EL device in the area 42 adversely affected by the generated heat is more noticeable than those in other areas, thus leading to a lowering in reliability of the display apparatus. Further, current to be supplied to all the pixel circuits passes through the pixel circuit common supply line 1, so that heat is generated by wiring resistance of the pixel circuit common supply line 1 itself. In this comparative embodiment, the pixel circuit common supply line 1 is disposed inside the common voltage line 21, so that the generated heat also directly affect adversely the display area 6. This also accelerates partial deterioration of the EL device.

As described in the respective embodiments of the present invention, by using the display apparatus of the present invention, it is possible to alleviate the thermal deterioration of the organic EL device. Further, with the progress of increase in screen size or resolution of the display area, electric power supplied to the display apparatus is also increased. For this reason, the thermal deterioration of the organic EL device can be effectively reduced.

Incidentally, in the display apparatuses of the embodiments described above, the organic EL device is used but the present invention is not limited thereto. The present invention is applicable to any display apparatus so long as it is capable of causing local heat generation by current.

In the above description, the single external terminal 5 is disposed at the lower side portion of the display area 6 but the present invention is not always limited thereto. The external terminal 5 may also be disposed at another side portion of the display area 6 (e.g., left or right side portion) or disposed so that a plurality of external terminals 5 is located at the same side portion of or a plurality of side portions of the display area.

The above described display apparatuses in the respective embodiments are the top emission-type organic EL display apparatus but the present invention is also applicable to an organic EL display apparatus of a bottom emission-type wherein light is emitted from a transparent substrate side where a pixel circuit is formed. In this case, a transparent electroconductive film is used as the pixel electrode constituting a first electrode (lower layer) formed on a substrate. A second electrode (upper layer) may be a transparent electrode. However, in the case of using reflected light, an electrode formed of metal material such as aluminum is used.

In the embodiments described above, current is carried from the common supply line to the EL device through the transistor constituting the pixel circuit for effecting current control and is outputted through the common voltage line. However, it is also possible to carry the current from the common voltage line to the EL device and output the current to the common supply line through the transistor constituting the pixel circuit for effecting current control. For example, in the pixel circuit shown in FIG. 2, the transistor (TFT) M1 is a PMOS transistor. However, it is also possible to use an NMOS transistor and connect a cathode (K) of the EL device to the transistor M4, an anode (A) of the EL device to the common voltage line VCC, and the transistor M1 to the grounded common supply line.

Embodiment 3

The above described display apparatuses of Embodiments 1 and 2 are capable of constituting an information display apparatus which is an apparatus capable of realizing a mobile phone, a mobile computer, a still camera, a video camera, and a multifunction apparatus of these apparatuses. The information display apparatus includes an information input portion. For example, in the case of the mobile phone, the information input portion is constituted by containing an antenna. In the case of a PDA or the mobile computer, the input portion includes an interface portion for a network. In the case of the still camera or the video (movie) camera, the information input portion includes a sensor portion such as CCD or CMOS.

As another embodiment of the present invention, a digital camera using the display apparatus described in Embodiment 1 or 2 is used in electronic equipment will be described.

Figure 6:
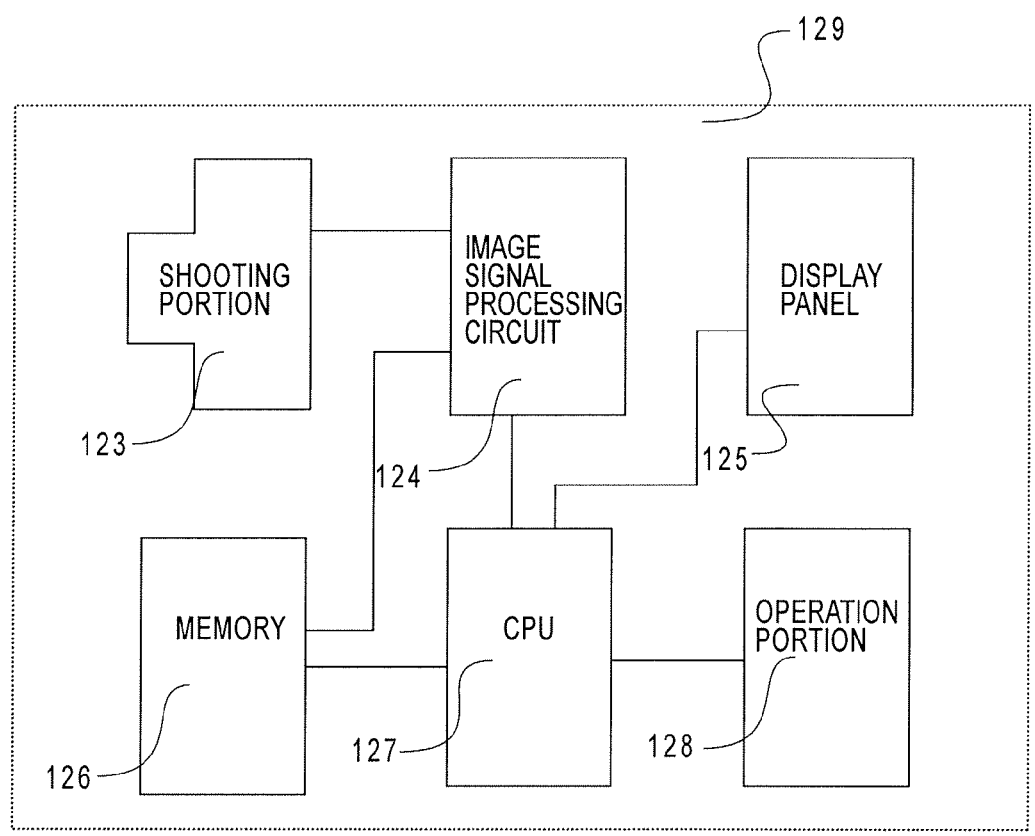
FIG. 6 is a block diagram showing an embodiment of a digital still camera.

FIG. 6 is a block diagram of an example thereof of a digital still camera. Referring to FIG. 6, an entire system 129 includes an image shooting portion 123 for shooting a subject, an image signal processing circuit 124, a display panel 125, a memory 126, a CPU 127, and an operation portion 128. An image which is shot by the shooting portion 123 or stored in the memory 126 is signal-processed by the image signal processing circuit 124, and is viewable by the display panel 125. The CPU 127 controls the shooting portion 123, the memory 126, the image signal processing circuit 124, and the like based on an input from the operation portion, thus effecting shooting, recording, reproduction, or display depending on situation.

As described hereinabove, according to the current drive-type apparatus of the present invention, it is possible to employ the EL device (constituting a current drive-type light-emitting device) represented by, e.g., an organic EL device, so that a display apparatus can be constituted by the current drive-type apparatus.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 331600/2005 filed Nov. 16, 2005, which is hereby incorporated by reference.

What is claimed is:

1. A display apparatus comprising:
a plurality of light emitting devices and a plurality of device control circuits for controlling current passing through said light emitting devices, said light emitting devices and said device control circuits being arranged on a substrate in a row direction and column direction to form a display area, wherein each of said light emitting devices has a lower first electrode and an upper second electrode on the substrate, the first electrode being provided for each light emitting device and electrically connected to an associated device control circuit for said light emitting device, and the second electrode being an electrode common to all said light emitting devices and extending to a periphery of the display area;
a first interconnecting line, disposed along a side of the display area, for supplying electric power to said device control circuits through power lines disposed in the display area;
a second interconnecting line disposed along a side of the display area to have an overlapping area overlapping with the extending second electrode through an insulating layer disposed therebetween, said second interconnecting line being electrically connected to the extended second electrode in a contact hole provided in the insulating layer in the overlapping area; and
an external connection terminal disposed at a peripheral portion of said apparatus along any one of the sides of the display area and electrically connected to said first interconnecting line and said second interconnecting line,
wherein at the peripheral portion of said apparatus side along one of the sides of the display area at which said external connection terminal is disposed, said first interconnecting line is disposed outside said second interconnecting line with respect to the display area, and
said first interconnecting line and said second interconnecting line establish a crossing with an overpass and underpass at an end portion of the peripheral portion, said first interconnecting line being disposed inside said second interconnecting line with respect to the display area at a side of the display area where the power lines are electrically connected to said first interconnecting line.

2. A display apparatus comprising:
a plurality of light emitting devices and a plurality of device control circuits for controlling current passing through said light emitting devices, said light emitting devices and said device control circuits being arranged on a substrate in a row direction and column direction to form a display area, wherein each of said light emitting devices has a lower first electrode and an upper second electrode on the substrate, the first electrode being provided for each light emitting device and electrically connected to an associated device control circuit for said light emitting device, and the second electrode being an electrode common to all said light emitting devices and extending to a periphery of the display area;
a first interconnecting line, disposed along a side of the display area, for supplying electric power to said device control circuits through power lines disposed in the display area;
a second interconnecting line disposed along a side of the display area to have an overlapping area overlapping with the extending second electrode through an insulating layer disposed therebetween, said second interconnecting line being electrically connected to the extended second electrode in a contact hole provided in the insulating layer in the overlapping area; and
an external connection terminal disposed at a peripheral portion of said apparatus along any one of the sides of the display area and electrically connected to said first interconnecting line and said second interconnecting line,
wherein at the peripheral portion of said apparatus side along one of the sides of the display area at which said external connection terminal is disposed, said first interconnecting line is disposed outside said second interconnecting line with respect to the display area, and
said first interconnecting line and said second interconnecting line establish a crossing with an overpass or underpass by electrically connecting said first interconnecting line to an electroconductive layer electrically isolated from said second interconnecting line through the insulating layer in the contact hole provided in the insulating layer.

3. A display apparatus comprising:
a plurality of light emitting devices and a plurality of device control circuits for controlling current passing through said light emitting devices, said light emitting devices and said device control circuits being arranged on a substrate in a row direction and column direction to form a display area, wherein each of said light emitting devices has a lower first electrode and an upper second electrode on the substrate, the first electrode being provided for each light emitting device and electrically connected to an associated device control circuit for said light emitting device, and the second electrode being an electrode common to all said light emitting devices and extending to a periphery of the display area;
a first interconnecting line, disposed along a side of the display area, for supplying electric power to said device control circuits through power lines disposed in the display area;
a second interconnecting line disposed along a side of the display area to have an overlapping area overlapping with the extending second electrode through an insulating layer disposed therebetween, said second interconnecting line being electrically connected to the extended second electrode in a contact hole provided in the insulating layer in the overlapping area; and
an external connection terminal disposed at a peripheral portion of said apparatus along any one of the sides of the display area and electrically connected to said first interconnecting line and said second interconnecting line,
wherein at the peripheral portion of said apparatus side along one of the sides of the display area at which said external connection terminal is disposed, said first interconnecting line is disposed outside said second interconnecting line with respect to the display area, and
at the peripheral portion, a power line for supplying electric power to a circuit disposed at the peripheral portion is disposed between said second interconnecting line and the display area.

4. A display apparatus comprising:
a plurality of light emitting devices and a plurality of device control circuits for controlling current passing through said light emitting devices, said light emitting devices and said device control circuits being arranged on a substrate in a row direction and column direction to form a display area, wherein each of said light emitting devices has a lower first electrode and an upper second electrode on the substrate, the first electrode being provided for each light emitting device and electrically connected to an associated device control circuit for said light emitting device, and the second electrode being an electrode common to all said light emitting devices and extending to a periphery of the display area;
a first interconnecting line, disposed along a side of the display area, for supplying electric power to said device control circuits through power lines disposed in the display area;
a second interconnecting line disposed along a side of the display area to have an overlapping area overlapping with the extending second electrode through an insulating layer disposed therebetween, said second interconnecting line being electrically connected to the extended second electrode in a contact hole provided in the insulating layer in the overlapping area; and
an external connection terminal disposed at a peripheral portion of said apparatus along any one of the sides of the display area and electrically connected to said first interconnecting line and said second interconnecting line,
wherein at the peripheral portion of said apparatus side along one of the sides of the display area at which said external connection terminal is disposed, said first interconnecting line is disposed outside said second interconnecting line with respect to the display area, and
at the peripheral portion, a circuit for convening a control signal inputted from said external connection terminal into a signal having an operation voltage for said display apparatus is disposed between said second interconnecting line and the display area.

* * * * *